US011405721B2

(12) United States Patent
    Kirkland

(10) Patent No.: US 11,405,721 B2
(45) Date of Patent: Aug. 2, 2022

(54) SUBMERSIBLE AUDIO AMPLIFIER

(71) Applicant: Gerald Kirkland, Kaufman, TX (US)

(72) Inventor: Gerald Kirkland, Kaufman, TX (US)

( * ) Notice: Subject to any disclaimer, the term of this patent is extended or adjusted under 35 U.S.C. 154(b) by 955 days.

(21) Appl. No.: 16/159,765

(22) Filed: Oct. 15, 2018

(65) Prior Publication Data
    US 2019/0149914 A1    May 16, 2019

Related U.S. Application Data

(60) Provisional application No. 62/585,748, filed on Nov. 14, 2017.

(51) Int. Cl.
    *H04R 1/44*      (2006.01)
    *H01R 13/523*    (2006.01)
    *H03F 3/183*     (2006.01)
    *H05K 5/06*      (2006.01)

(52) U.S. Cl.
    CPC .............. *H04R 1/44* (2013.01); *H01R 13/523* (2013.01); *H03F 3/183* (2013.01); *H05K 5/065* (2013.01); *H05K 5/069* (2013.01); *H03F 2200/03* (2013.01)

(58) Field of Classification Search
    None
    See application file for complete search history.

(56) References Cited

U.S. PATENT DOCUMENTS

| | | | |
|---|---|---|---|
| 2005/0123161 A1* | 6/2005 | Polany | H04R 1/44 381/334 |
| 2007/0086273 A1* | 4/2007 | Polany | H04R 1/021 367/131 |
| 2008/0095382 A1* | 4/2008 | Mott | H04R 1/02 381/189 |
| 2012/0171912 A1* | 7/2012 | Ewing | H04R 1/028 441/106 |
| 2014/0193017 A1* | 7/2014 | Fortin | H04R 1/021 381/334 |

\* cited by examiner

*Primary Examiner* — Qin Zhu
(74) *Attorney, Agent, or Firm* — William Lovin & Associates LLC; William R. Lovin

(57) ABSTRACT

The present invention relates to an audio amplifier that is constructed to allow its mounting and use underwater. The invention has a water impervious case and has waterproof electrical contacts for power, audio, and control.

6 Claims, 3 Drawing Sheets

SUBMERSIBLE AUDIO AMPLIFIER

CROSS-REFERENCE TO RELATED APPLICATIONS

This application makes reference to U.S. Prov. Pat. No. 62/585,748 filed Nov. 14, 2017 and incorporated in its entirety by reference.

FIELD OF THE INVENTION

The present invention relates to an audio amplifier that is constructed to allow its mounting and use underwater. The invention has a water impervious case and has waterproof electrical contacts for power, audio, and control.

BACKGROUND OF THE INVENTION

Recreational vehicles have been equipped with audio equipment for decades. Speakers, receivers, amplifiers, and audio control devices are well known on such vehicles. As these vehicles have been adapted for use in wetter environments, present audio equipment has been impacted by water and water-borne contaminants.

But unknown in art are speakers, receivers, amplifiers, and audio control devices that are impervious to water infusion, i.e. are waterproof. Primarily, this is due to the difficulty waterproofing the electrical connectors present on such devices. For example, waterproofing the speaker and power inputs is difficult.

Accordingly, a first embodiment of the present invention is directed towards a waterproof audio amplifier with water-impervious speaker, input, power, and control device interfaces is presented.

A second embodiment of the present invention includes waterproof control devices for the invention.

SUMMARY OF THE INVENTION

One embodiment of the present invention presents an audio amplifier that includes a waterproof case and waterproof speaker, input, power, and control device interface connectorization methods. The audio amplifier may be any type of audio amplifier but generally will be semiconductor based. The audio amplifier may be Class A, B, A/B, or D, or any other class of audio amplifier. The waterproof case has a series of ridges, or fins, used to dissipate thermal energy created as the amplifier is used.

The connectorization method is consistent for all embodiments of the invention. Specifically, the waterproof case is molded or machined with an internal flange at each connection point including speaker, input, power, and control device connection points. This internal flange is at a level below the median level of the outside of the waterproof case.

Adhering to this flange is a double-sided sticky plastic sealing tape. This sealing tape is generally silicone tape with adhesive applied to both sides. The tape is perforated to pass screws and cables through into the interior of the waterproof case of the audio amplifier. Molded onto each cable so that it surrounds the cable where it passes through into the interior of the audio amplifier is an elastomeric mass. The elastomeric mass is sized such that it fits intimately inside a harness grommet. The harness grommet is constructed of silicone or rubber. The harness grommet has screw holes or slots for passing screws through the sealing tape and into the waterproof case of the audio amplifier. Outside of the harness grommet is a metal bracket for securing the cable to the waterproof case of the audio amplifier. The metal bracket has screw holes or slots and a hole for the exterior aspect of the cable and the elastomeric mass. Outside of the metal bracket are screws for adhering the cable with its intimately molded elastomeric mass, the metal bracket, the harness grommet, and the double sided sticky tape to the waterproof case of the audio amplifier. The same multi-level connectorization philosophy is applied to all cables entering the audio amplifier.

Of course, not all openings in the waterproof case are for cables. For example, one opening is to install the circuit board comprising the amplifier in the waterproof housing. This opening is sealed in any of the usual methods, including preferably a monolithic rubber gasket running the entirety of the periphery of the waterproof case. A metal plate is then affixed and fastened to the waterproof case by multiple closely spaced screws. By this means a waterproof seal is secured.

Also, other types of equipment, such as crossovers, may be attached. Also, waterproof keys or actuators may be installed. Ordinarily, these would be installed remotely, above the level of water.

DETAILED DESCRIPTION OF THE INVENTION

Figure 1:
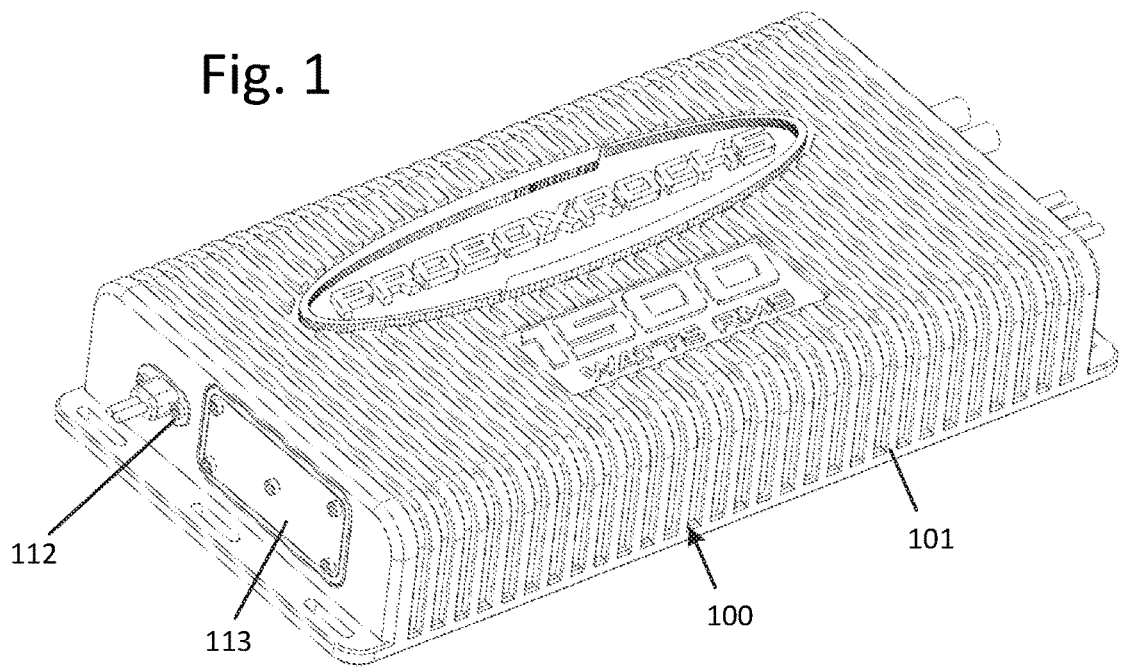
FIG. 1 is a view of one end of the invention showing the power connector and the crossover connector.
Figure 2:
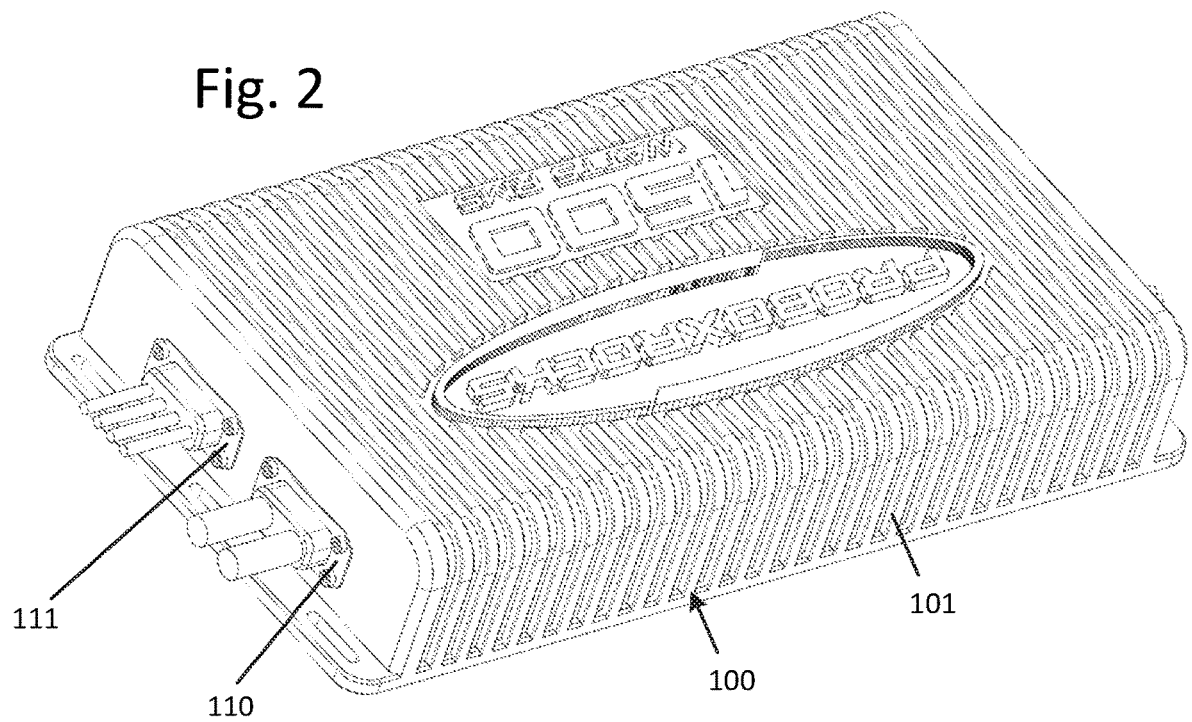
FIG. 2 is a view of the opposite end of the invention showing speaker output connectors and input connectors.
Figure 3:
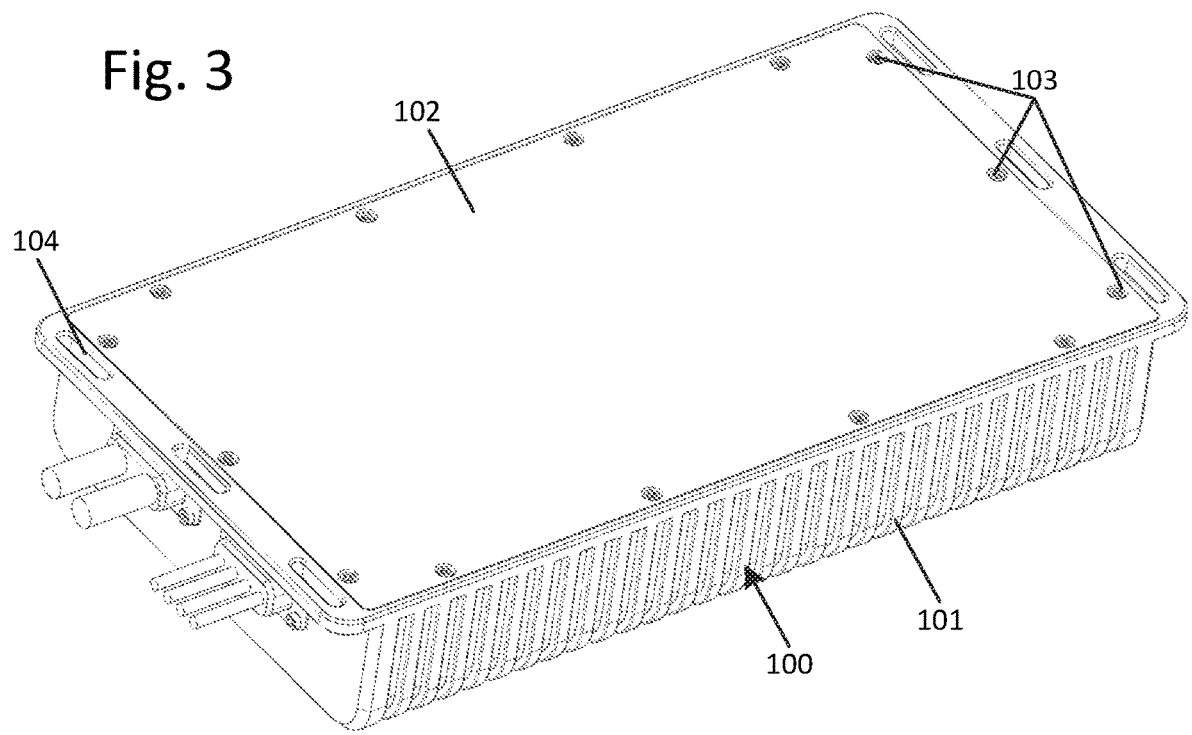
FIG. 3 is a view of the base of the invention.
Figures 4, 5:
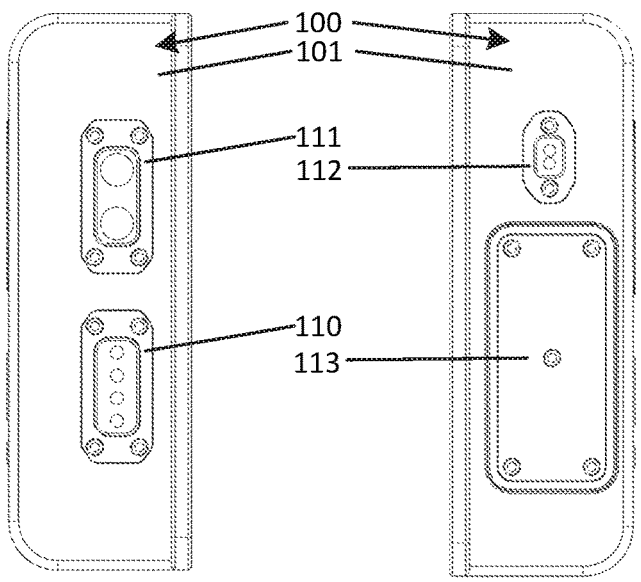
FIG. 4 is a view of the end of the submersible amplifier showing an input and a speaker output connector.
FIG. 5 is a view of the opposite end of the submersible amplifier showing a crossover and a power connector.

Turning now to FIGS. 1 through 5, one embodiment of the present invention presents molded waterproof amplifier box 100 comprising housing 101. Housing 101 is made of water impervious materials such as aluminum, plastic, or composite materials. Due to its superior heat conduction, aluminum is preferred. Housing 101 has numerous fins or ridges to increase its surface area. Housing 101 has metal bracket 112 securing the power cable and, for example, crossover connector 113. The other end of housing 101 has metal bracket 110 securing the speaker output connector and metal bracket 111 securing the input connector. Bottom 102 is also made of water impervious materials such as aluminum, plastic, or composite materials. As before, due to its superior heat conduction, aluminum is preferred. Bottom 102 is affixed to housing 101 by means of a multiplicity of screws 103. At least one flange is present on the bottom edge of housing 101. Machined or otherwise formed through this flange are a multiplicity of slots 104 for affixing waterproof amplifier box 100 to a vehicle by means of screws or bolts.

Figure 6:
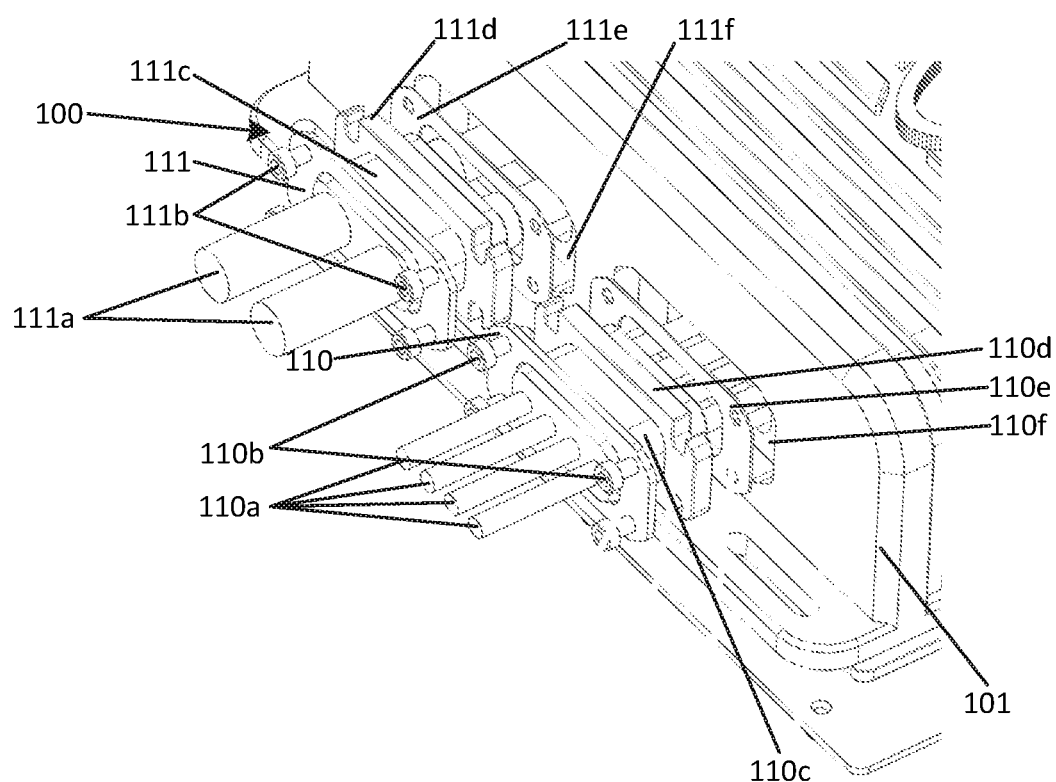
FIG. 6 is a detailed view showing two disassembled connectors.

Turning now to FIG. 6, one embodiment of the present invention showing disassembled metal bracket 111 securing the input connector and disassembled metal bracket 110 securing the speaker output connector.

Metal bracket 111 securing the input connector is based on flange 111f which is machined or otherwise formed into housing 101. Internally installed on flange 111f is double-sided sticky plastic sealing tape 111e. Double-sided sticky plastic sealing tape 111e is generally silicone tape with adhesive applied to both sides. Double-sided sticky plastic sealing tape 111e is formed with holes for screws 111b, input cables 111a, and elastomeric mass 111c. Surrounding elastomeric mass 111c where it passes through into the interior of waterproof amplifier box 100 is harness grommet 111d. Harness grommet 111d is constructed of silicone or rubber. Harness grommet 111d has screw holes or slots for passing screws 111b through double-sided sticky plastic sealing tape 111e and into housing 101 of waterproof amplifier box 100. Outside of harness grommet 111d is metal bracket 111 for securing input cable 111a and elastomeric mass 111c to housing 101 of waterproof amplifier box 100. Metal bracket 111 has screw holes or slots and a hole for the exterior aspect of input cable 111a and elastomeric mass 111c. Outside metal bracket 111 are screws 111b for adhering metal bracket 111, harness grommet 111d, exterior aspect of input cable 111a and elastomeric mass 111c, and double-sided sticky plastic sealing tape 111e to housing 101 of waterproof amplifier box 100.

The connector is assembled as follows: First, harness grommet 111d is affixed to elastomeric mass 111c. This may be done using adhesive or in manufacture where harness grommet 111d and elastomeric mass 111c are molded in one piece. Next, double-sided sticky plastic sealing tape 111e is installed on flange 111f. Next, combined harness grommet 111d and elastomeric mass 111c is placed on the outside side of double-sided sticky plastic sealing tape 111e. Next, metal bracket 111 is placed over elastomeric mass 111c. Next, metal bracket 111 is secured to housing 101 of waterproof amplifier box 100 by means of screws 111b.

Metal bracket 110 securing the output connector is based on flange 110f which is machined or otherwise formed into housing 101. Internally installed on flange 110f is double-sided sticky plastic sealing tape 110e. Double-sided sticky plastic sealing tape 110e is generally silicone tape with adhesive applied to both sides. Double-sided sticky plastic sealing tape 110e is formed with holes for screws 110b, output cables 110a, and elastomeric mass 110c. Surrounding elastomeric mass 110c where it passes through into the interior of waterproof amplifier box 100 is harness grommet 110d. Harness grommet 110d is constructed of silicone or rubber. Harness grommet 110d has screw holes or slots for passing screws 110b through double-sided sticky plastic sealing tape 110e and into housing 101 of waterproof amplifier box 100. Outside of harness grommet 110d is metal bracket 110 for securing output cable 110a and elastomeric mass 110c to housing 101 of waterproof amplifier box 100. Metal bracket 110 has screw holes or slots and a hole for the exterior aspect of output cable 110a and elastomeric mass 110c. Outside metal bracket 110 are screws 110b for adhering metal bracket 110, harness grommet 110d, exterior aspect of output cable 110a and elastomeric mass 110c, and double-sided sticky plastic sealing tape 110e to housing 101 of waterproof amplifier box 100.

This connector is assembled as follows: First, harness grommet 110d is affixed to elastomeric mass 110c. This may be done using adhesive or in manufacture where harness grommet 110d and elastomeric mass 110c are molded in one piece. Next, double-sided sticky plastic sealing tape 110e is installed on flange 110f. Next, combined harness grommet 110d and elastomeric mass 110c is placed on the outside side of double-sided sticky plastic sealing tape 110e. Next, metal bracket 110 is placed over elastomeric mass 110c. Next, metal bracket 110 is secured to housing 101 of waterproof amplifier box 100 by means of screws 110b.

Turning now to FIGS. 1 through 6, of course, not all openings in waterproof amplifier box 100 are for cables. For example, one opening is to install the circuit board comprising the amplifier in the housing 101. This opening is sealed in any of the usual methods, including preferably a monolithic rubber gasket running the entirety of the periphery of housing 101. Bottom 102 is then affixed and fastened to housing 101 by multiple closely spaced screws 103. By this means a waterproof seal is secured.

While the present invention has been described in what are thought to be the most useful and practical embodiments, it will be readily apparent to those having skill in the art that other variations may be readily conceived and created. For example, while the present invention discloses that elastomeric masses 111c and 110c are molded as part of input cables 111a and speaker output cables 110a, respectively, both input cables 111a and speaker output cables 110a may be formed such that elastomeric masses 111c and/or 110c are independent from the cables and may be separately slipped over the cables. Similarly, one having skill in the art will recognize that the input cable connector, the output cable connector, and the power cable connector may be combined into two connectors. Also, one having skill in the art will recognize that the input cable connector, the output cable connector, and the power cable connector may be combined into one connector. Accordingly, these and all such other readily conceived and created variations are implicitly included in the spirit and scope of the present disclosure.

What is claimed is:
1. A submersible audio amplifier comprising:
 a) an amplifier;
 b) a monolithic waterproof cover;
 c) a base with a waterproof seal between the waterproof cover and the base wherein the base is affixed to the monolithic waterproof cover and the amplifier inside by a multiplicity of screws;
 d) an input connector further comprising double-sided sticky tape applied in a first recessed cavity formed in the monolithic waterproof cover wherein a harness grommet with encapsulated cables and elastomeric mass is inserted and secured by a first externally mounted metal plate and a multiplicity of screws;
 e) an output connector further comprising double-sided sticky tape applied in a second recessed cavity formed in the monolithic waterproof cover wherein a harness grommet with encapsulated cables and elastomeric mass is inserted and secured by a second externally mounted metal plate and a multiplicity of screws; and
 f) a power connector further comprising double-sided sticky tape applied in a third recessed cavity formed in the monolithic waterproof cover wherein a harness grommet with encapsulated cables and elastomeric mass is inserted and secured by a third externally mounted metal plate and a multiplicity of screws.

2. A submersible audio amplifier of claim 1 wherein the monolithic waterproof cover has grooves formed in its external surface.

3. A submersible audio amplifier of claim 1 wherein the input connector, the output connector, and the power connector are combined to form one connector.

4. A submersible audio amplifier of claim 1 wherein the input connector and the output connector are combined to form one connector.

5. A submersible audio amplifier of claim 1 wherein the input connector, the output connector, and the power connector are mounted on double-sided sticky tape waterproof seals mounted on flanges machined or otherwise formed in the monolithic waterproof cover.

6. A submersible audio amplifier of claim 1 wherein the base is mounted on a waterproof seal mounted on a flange machined or otherwise formed in the monolithic waterproof cover.

\* \* \* \* \*